United States Patent [19]
Gardner et al.

[11] Patent Number: 6,027,978
[45] Date of Patent: Feb. 22, 2000

[54] METHOD OF MAKING AN IGFET WITH A NON-UNIFORM LATERAL DOPING PROFILE IN THE CHANNEL REGION

[75] Inventors: Mark I. Gardner, Cedar Creek; Michael Duane; Daniel Kadosh, both of Austin, all of Tex.

[73] Assignee: Advanced Micro Devices, Inc., Sunnyvale, Calif.

[21] Appl. No.: 08/787,036

[22] Filed: Jan. 28, 1997

[51] Int. Cl.$^7$ .................................................. H01L 21/336
[52] U.S. Cl. .......................... 438/289; 438/276; 438/286; 438/278; 438/290; 438/291; 438/303; 438/305; 438/307
[58] Field of Search ..................................... 438/153, 154, 438/199, 200, 217, 230, 231, 275, 276, 290, 291, 277, 278, 286, 289, 303, 305, 307, 306, FOR 161, FOR 162, FOR 163, FOR 175, FOR 171, FOR 168, FOR 190, FOR 187, FOR 199, FOR 182, FOR 204, FOR 205, 595, 527, 529

[56] References Cited

U.S. PATENT DOCUMENTS

| | | |
|---|---|---|
| 4,208,780 | 6/1980 | Richman . |
| 4,225,875 | 9/1980 | Ipri ............................................. 357/23 |
| 4,272,881 | 6/1981 | Angle ........................................ 29/571 |
| 4,329,186 | 5/1982 | Kotecha et al. .......................... 148/1.5 |
| 4,356,042 | 10/1982 | Gedaly . |
| 4,889,820 | 12/1989 | Mori . |
| 4,927,777 | 5/1990 | Hsu et al. .................................. 437/44 |
| 5,073,514 | 12/1991 | Ito et al. .................................... 437/44 |
| 5,091,328 | 2/1992 | Miller . |
| 5,132,753 | 7/1992 | Chang et al. ........................... 357/23.4 |
| 5,171,700 | 12/1992 | Zamanian .................................. 437/44 |
| 5,200,358 | 4/1993 | Bollinger et al. ........................ 437/180 |
| 5,286,664 | 2/1994 | Horiuchi ................................... 437/44 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 61-194777 | 8/1986 | Japan . |
| 1-18762 | 1/1992 | Japan . |
| 08078672 | 3/1996 | Japan . |

Primary Examiner—Mary Wilczewski
Attorney, Agent, or Firm—Skjerven Morrill, MacPherson Franklin & Friel, L.L.P.; Willaim W. Holloway

[57] ABSTRACT

A method of making an IGFET with a selectively doped channel region is disclosed. The method includes providing a semiconductor substrate with a device region, forming a gate over the device region, forming a masking layer that partially covers the gate and the device region, implanting a dopant into portions of the gate and the device region outside the gate that are not covered by the masking layer, transferring the dopant through the uncovered portion of the gate into a portion of an underlying channel region in the device region, thereby providing the channel region with a non-uniform lateral doping profile and adjusting a threshold voltage, and forming a source and a drain in the device region. The dopant can be implanted through the portion of the gate into the portion of the channel region, or alternatively, the dopant can be diffused from the portion of the gate into the portion of the channel region. In addition, the dopant can be the same conductivity type as the channel region, thereby increasing the dopant concentration of the portion of the channel region and adjusting the threshold voltage away from zero, or the dopant can be opposite conductivity type as the channel region, thereby decreasing the dopant concentration of the portion of the channel region and adjusting the threshold voltage towards zero. Preferably, the gate is polysilicon and the masking layer is photoresist. Advantageously, the invention is well-suited for adjusting the threshold voltage, and therefore the drive current, leakage current and speed, of selected IGFETs, so that the fastest IGFETs with the highest leakage currents can be placed in critical speed paths such as common lines in SRAM arrays.

44 Claims, 10 Drawing Sheets

U.S. PATENT DOCUMENTS

| | | | |
|---|---|---|---|
| 5,296,398 | 3/1994 | Noda | 437/44 |
| 5,328,863 | 7/1994 | Cappelletti et al. | |
| 5,349,225 | 9/1994 | Redwine et al. | 257/336 |
| 5,350,703 | 9/1994 | Lee | |
| 5,364,807 | 11/1994 | Hwang | 437/44 |
| 5,366,915 | 11/1994 | Kadama | 437/43 |
| 5,397,715 | 3/1995 | Miller | 437/27 |
| 5,413,949 | 5/1995 | Hong | |
| 5,424,234 | 6/1995 | Kwon | 437/44 |
| 5,436,482 | 7/1995 | Ogoh | 257/344 |
| 5,441,906 | 8/1995 | Burger | |
| 5,451,807 | 9/1995 | Fujita | 257/404 |
| 5,482,878 | 1/1996 | Burger et al. | |
| 5,486,487 | 1/1996 | Ginami et al. | |
| 5,510,279 | 4/1996 | Chien et al. | 437/41 |
| 5,512,503 | 4/1996 | Hong | 437/43 |
| 5,518,940 | 5/1996 | Hodate et al. | 437/41 |
| 5,521,417 | 5/1996 | Wada | 257/390 |
| 5,525,552 | 6/1996 | Huang | 437/41 |
| 5,547,885 | 8/1996 | Ogoh | 437/44 |
| 5,547,888 | 8/1996 | Yamazaki | 437/52 |
| 5,578,509 | 11/1996 | Fujita | 437/35 |
| 5,585,293 | 12/1996 | Sharma et al. | 437/43 |
| 5,585,658 | 12/1996 | Mukai et al. | 257/344 |
| 5,591,650 | 1/1997 | Hsu et al. | 437/21 |
| 5,607,869 | 3/1997 | Yamazaki | 437/40 |
| 5,648,286 | 7/1997 | Gardner et al. | 437/44 |
| 5,654,215 | 8/1997 | Gardner et al. | 438/286 |
| 5,656,518 | 8/1997 | Gardner et al. | 438/286 |
| 5,672,531 | 9/1997 | Gardner et al. | 437/44 |
| 5,677,224 | 10/1997 | Kadosh et al. | 437/57 |
| 5,681,772 | 10/1997 | Chen et al. | |
| 5,817,551 | 10/1998 | Fujii et al. | 438/291 |
| 5,851,886 | 12/1998 | Peng | 438/289 |
| 5,882,974 | 3/1999 | Gardner et al. | 438/286 |
| 5,891,782 | 4/1999 | Hsu et al. | 438/302 |

METHOD OF MAKING AN IGFET WITH A NON-UNIFORM LATERAL DOPING PROFILE IN THE CHANNEL REGION

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGF BT involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. Thereafter, the gate provides an implant mask during the formation of source and drain regions by ion implantation, and the implanted dopants are driven-in and activated using a high-temperature anneal that would otherwise melt the aluminum.

The threshold voltage ($V_T$) is the minimum gate voltage required to induce the channel. For enhancement-mode devices, the positive gate voltage of an N-channel device must be larger than some threshold voltage before a conducting channel is induced, and the negative gate voltage of a P-channel device must be more negative than some threshold voltage to induce the required positive charge (mobile holes) in the channel.

Extensive efforts are being directed towards miniaturizing IGFETs in order to increase the speed and density of the integrated circuit chips in which they are used. To increase speed, the saturation drain current ($I_{DSAT}$), also referred to as drive current, must often be increased to allow faster charging and discharging of parasitic capacitances. In short channel devices, the drive current is proportional to the difference between the gate-to-source voltage ($V_{GS}$) and the threshold voltage. Shifting the threshold voltage towards zero increases the drive current, and shifting the threshold voltage away from zero decreases the drive current.

A threshold adjust implant that adjusts the doping concentration in the channel region is often used for precisely controlling the threshold voltage. The threshold adjust implant usually occurs before forming the gate, although threshold adjust implants through the gate have also been reported. As the doping concentration in the channel region increases, the threshold voltage shifts away from zero (thereby decreasing the drive current), and likewise, as the doping concentration in the channel region decreases, the threshold voltage shifts towards zero (thereby increasing the drive current).

Unfortunately, decreasing the doping concentration in the channel region also increases the source-drain off-state leakage current. Although increasing the channel length decreases the leakage current, it also reduces packing density. In VLSI chips such as microprocessors which contain hundreds of thousands or millions of IGFETs, the leakage currents of individual IGFETs are usually limited to about 1 to 10 nanoamps in order to prevent excessive power consumption. To keep the leakage rents within an acceptable range, yet still provide high packing density, VLSI chips usually employ submicron IGFETs with relatively high channel doping, which constrains drive currents and speed.

Accordingly, a need exists for a fabrication process which allows selected IGFETs to have channel doping that differs from that of other IGFETs so that the fastest devices, with the largest drive currents and leakage currents, can be placed in critical speed paths.

SUMMARY OF THE INVENTION

An object of the present invention is provide an IGFET with a selectively doped channel region that exhibits a non-uniform lateral doping profile. That is, the channel doping varies as a function of lateral position between the source and the drain. This is accomplished by applying a threshold adjust implant while a masking layer covers a portion of the gate without covering another portion of the gate, so that the doping concentration in a selected portion of the channel region is adjusted. In this manner, the threshold voltage, as well as the drive current, leakage current, and speed of selected IGFETs can be adjusted, so that the fastest IGFETs with the highest drain currents and leakage currents can be placed in critical speed paths such as common lines in SRAM arrays.

In accordance with one aspect of the invention, a method of making an IGFET includes providing a semiconductor substrate with a device region, forming a gate over the device region, forming a masking layer that partially covers the gate and the device region, implanting a dopant into portions of the gate and the device region outside the gate that are not covered by the masking layer, transferring the dopant through the uncovered portion of the gate into a portion of an underlying channel region in the device region, thereby providing the channel region with a non-uniform lateral doping profile and adjusting a threshold voltage, and forming a source and a drain in the device region.

The dopant can be implanted through the portion of the gate into the portion of the channel region, or alternatively, the dopant can be diffused from the portion of the gate into the portion of the channel region. In addition, the dopant can be the same conductivity type as the channel region, thereby increasing the dopant concentration of the portion of the channel region and adjusting the threshold voltage away from zero, or the dopant can be opposite conductivity type as the channel region, thereby decreasing the dopant concentration of the portion of the channel region and adjusting the threshold voltage towards zero.

The masking layer can cover a first sidewall of the gate without covering an opposing second sidewall of the gate, or alternatively, the masking layer can cover both sidewalls without covering a portion of the gate between and spaced from the sidewalls.

In the event the masking layer covers the first sidewall without covering the second sidewall, the method may include implanting a second dopant, using the masking layer as an implant mask, so that the second dopant provides substantial doping for the source without providing essentially any doping for the drain. In this fashion, an asymmetrical IGFET can be fabricated in which the source includes a heavily doped source region that provides a channel junction, and the drain includes a lightly doped drain region that provides another channel junction.

The dopant can be implanted before forming the source and drain, after forming the source and drain, or after partially forming the source and drain. For instance, the dopant can be implanted after forming lightly doped source and drain regions and spacers adjacent to opposing sidewalls of the gate, but before implanting heavily doped source and drain regions.

Preferably, the gate is polysilicon and the masking layer is photoresist.

Advantageously, the threshold voltage of selected IGFETs can be adjusted so that the fastest IGFETs (with the highest leakage current), constituting a small fraction of the IGFETs on a chip, can be placed in critical speed paths while the slower IGFETs (that exhibit less leakage current), constituting the vast majority of the IGFETs on the chip, can be placed in other circuit regions where speed is less important. This helps optimize the tradeoff between power consumption and speed. Another advantage is that the masking layer can be patterned to provide a wide range of channel doping throughout the chip. Still another advantage is that the masking layer can provide an implant mask for another implant step that dopes the source, without doping the drain, during the fabrication of an asymmetrical device.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 4A–4I show cross-sectional views of successive process steps for making an IGFET with a non-uniform lateral doping profile in the channel region in accordance with a fourth embodiment of the invention.

DETAILED DESCRIPTION OF THE PREFERRED EMBODIMENTS

Figure 1A:
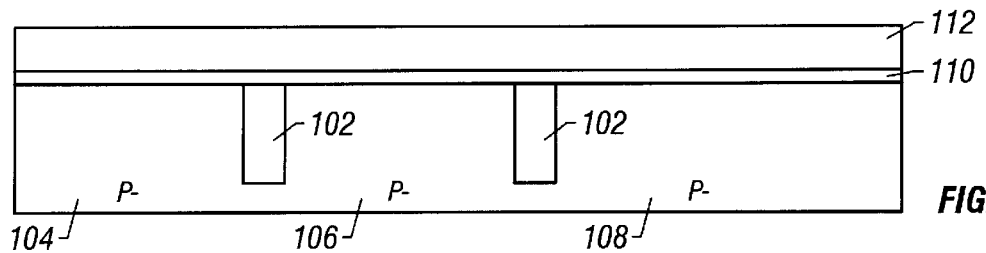
FIGS. 1A–1H show cross-sectional views of successive process steps for making an IGFET with a non-uniform lateral doping profile in the channel region in accordance with a first embodiment of the invention.

In the drawings, depicted elements are not necessarily drawn to scale and like or similar elements may be designated by the same reference numeral throughout the several views.

FIGS. 1A–1H show cross-sectional views of successive process steps for making an IGFET with a non-uniform lateral doping profile in the channel region in accordance with a first embodiment of the invention.

In FIG. 1A, a silicon substrate suitable for integrated circuit manufacture is provided. The substrate includes a P− type epitaxial surface layer with a planar top surface disposed on a P+ base layer (not shown). The epitaxial surface layer has a boron background concentration on the order of $1 \times 10^{16}$ atoms/cm$^3$, a <100> orientation and a resistivity of 12 ohm-cm. If desired, the epitaxial surface layer can be subjected to a well implant and/or punchthrough implant. Trench oxides 102, composed of silicon dioxide (SiO$_2$), with a depth on the order of 3000 angstroms, provide dielectric isolation between devices regions 104, 106 and 108 in the substrate. A blanket layer of gate oxide 110, composed of silicon dioxide, is formed on the top surface of the substrate using tube growth at a temperature of 700 to 1000° C. in an O$_2$ containing ambient. Gate oxide 110 has a thickness in the range of 30 to 60 angstroms. Thereafter, polysilicon layer 112 is deposited by low pressure chemical vapor deposition on the top surface of gate oxide 110. Polysilicon layer 112 is undoped and has a thickness of 2000 angstroms. If desired, polysilicon layer 112 can be doped in situ as deposition occurs, or doped immediately after deposition by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that gates to be formed from portions of polysilicon layer 112 be initially doped during a later processing step.

Figure 1B:
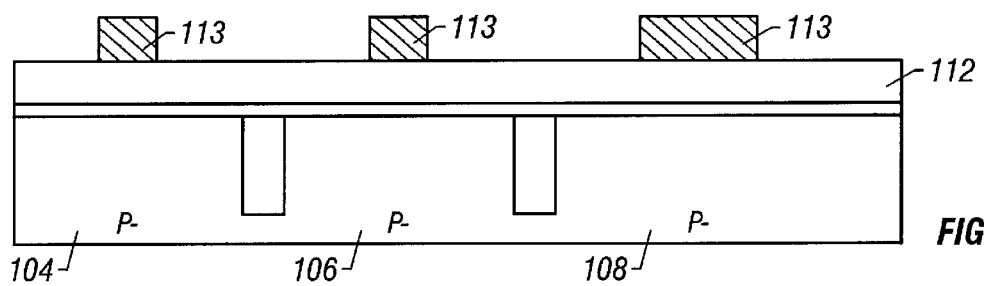

In FIG. 1B, photoresist layer 113 is deposited on polysilicon layer 112. A photolithographic system, such as a step and repeat optical projection system which generates deep ultraviolet light from a mercury-vapor lamp, uses a first reticle to irradiate photoresist layer 113 with a first image pattern Thereafter, the irradiated portions of photoresist layer 113 are removed by a developer, and photoresist layer 113 includes openings above selected portions of device regions 104, 106 and 108.

Figure 1C:
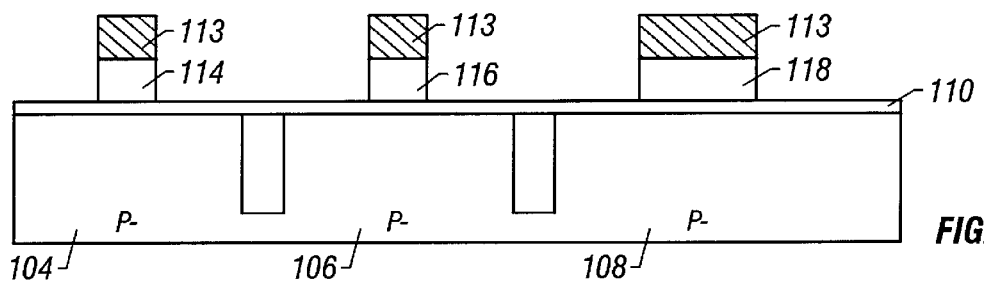

In FIG. 1C, an anisotropic dry etch is applied using photoresist layer 113 as an etch mask. Photoresist layer 113 protects the underlying portions of polysilicon layer 112, and the etch removes portions of polysilicon layer 112 beneath the openings in photoresist layer 113. The etch is highly selective of polysilicon layer 112 with respect to gate oxide 110, so only a negligible amount of gate oxide 110 is removed and the substrate is unaffected. The etch forms gates 114, 116 and 118 from the unetched portions of polysilicon layer 112 over device regions 104, 106 and 108, respectively. Gates 114 and 116 each have opposing vertical sidewalls separated by a length of 3500 angstroms, representing the minimum resolution of the photolithographic system, and gate 118 has opposing vertical sidewalls separated by a length of 7000 angstroms. Gates 114, 116 and 118 each have a thickness (or height above the underlying gate oxide 110) of 2000 angstroms.

Figure 1D:
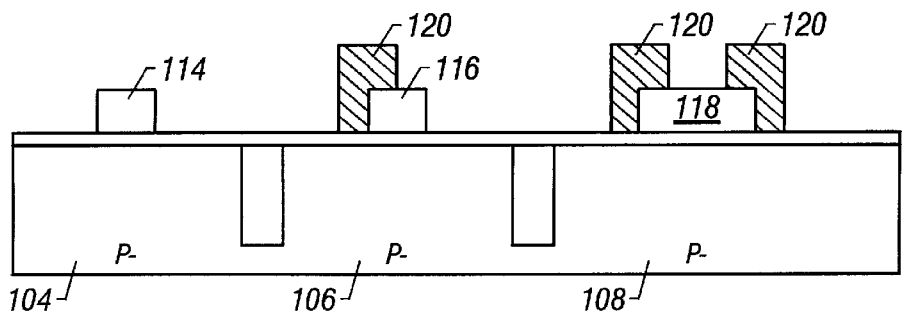

In FIG. 1D, photoresist layer 113 is stripped, and photoresist layer 120 is deposited over the substrate. The photolithographic system uses a second reticle to irradiate photoresist layer 120 with a second image pattern. Thereafter, the irradiated portions of photoresist layer 120 are removed so that photoresist layer 120 includes openings above selected portions of device regions 104, 106 and 108. In particular, photoresist layer 120 covers a portion of device region 106 outside gate 116, a portion of gate 116 that includes its left sidewall, a portion of device region 108 outside gate 118, and a portion of gate 118 that includes its sidewalls. Furthermore, photoresist layer 120 includes openings above the entire device region 104 and gate 114, a portion of device region 106 outside gate 116, a portion of gate 116 that includes its right sidewall, a portion of device region 108 outside gate 118, and a portion of gate 118 between and spaced from its sidewalls.

Figure 1E:
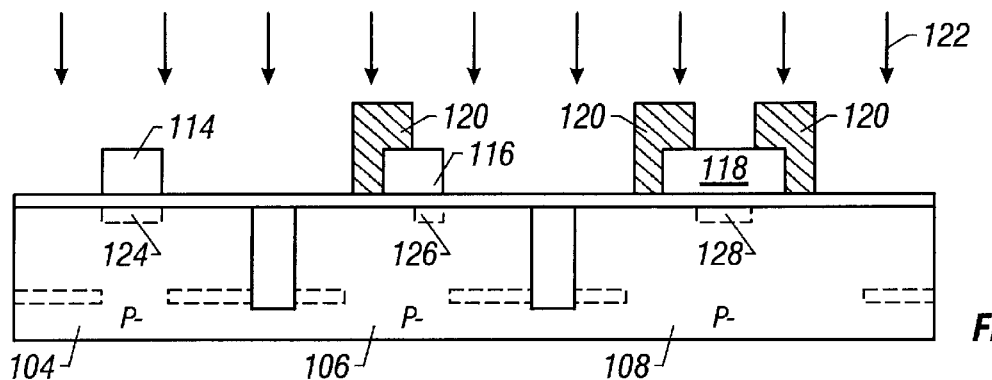

In FIG. 1E, a threshold adjust implant is applied by subjecting the structure to ion implantation of boron, indicated by arrows 122, at a dose in the range of about $4\times10^{12}$ to $9\times10^{12}$ atoms/cm$^2$ and an energy of about 65 kiloelectron-volts. Essentially none of the boron that impinges upon photoresist layer 120 or trench oxides 102 is implanted therethrough. Essentially all of the boron that impinges upon the uncovered portions of the device regions outside the gates is implanted into those portions of the device regions, far below the top surface of the substrate, to a depth that is similar to the thickness of the gates. Most of the boron that impinges upon the uncovered portions of the gates is implanted through those portions of the gates, and through portions of the underlying gate oxide 110 into portions of the underlying channel regions in the respective device regions, at or near the top surface of the substrate. The regions of the substrate in which the boron is implanted are depicted by the broken lines. These regions, which are highly localized both vertically and laterally, include threshold adjust regions 124, 126 and 128 in the channel regions in device regions 104, 106 and 108, respectively. Threshold adjust regions 124, 126 and 128 have a boron concentration in the range of about $5\times10^{16}$ to $5\times10^{17}$ atoms/cm$^3$.

Threshold adjust region 124 occupies the entire channel region in device region 104, threshold adjust region 126 occupies about 50% of the channel region in device region 106 (aligned with the right sidewall of gate 116), and threshold adjust region 128 occupies about 50% of the channel region in device region 108 (equally spaced between the sidewalls of gate 118). The threshold adjust regions increase the net doping concentrations in the channel regions of device regions 104, 106 and 108. Furthermore, since threshold adjust region 124 increases the doping concentration in the entire channel region in device region 104, but threshold adjust region 126 increases the doping concentration in about 50% of the channel region in device region 106, the IGFET to be fabricated in device region 106 shall have a lower threshold voltage, and therefore a higher drain current and leakage current, than the IGFET to be fabricated in device region 104.

Figure 1F:
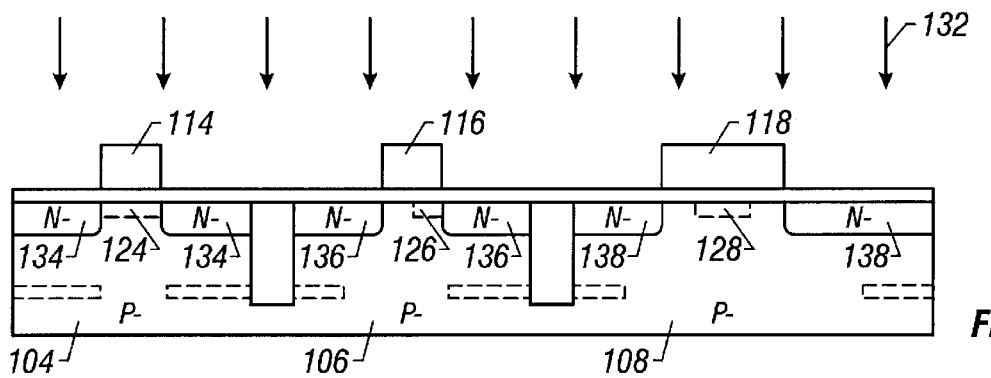

In FIG. 1F, photoresist layer 120 is stripped, and lightly doped source and drain regions are implanted into the device regions by subjecting the structure to ion implantation of phosphorus, indicated by arrows 132, at a dose in the range of $1\times10^{13}$ to $5\times10^{14}$ atoms/cm$^2$ and an energy of 30 to 45 kiloelectron-volts, using gates 114, 116 and 118 as an implant mask. As a result, lightly doped source/drain regions 134 are implanted into device region 104 and are self-aligned to the opposing sidewalls of gate 114, lightly doped source/drain regions 136 are implanted into device region 106 and are self-aligned to the opposing sidewalls of gate 116, and lightly doped source/drain regions 138 are implanted into device region 108 and are self-aligned to the opposing sidewalls of gate 118. Moreover, lightly doped source/drain regions 134, 136 and 138 are adjacent to the channel regions in device regions 104, 106 and 108, respectively. Lightly doped source/drain regions 134, 136 and 138 are doped N− with an phosphorus concentration in the range of about $1\times10^{17}$ to $1\times10^{18}$ atoms/cm$^3$. Preferably, lightly doped source/drain regions 134, 136 and 138 have a phosphorus concentration that exceeds the boron concentration in threshold adjust regions 124, 126 and 128.

Figure 1G:
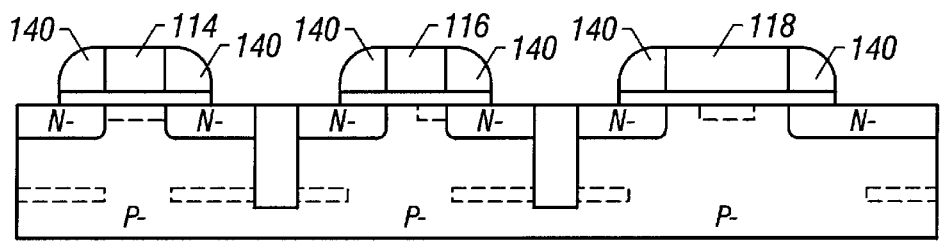

In FIG. 1G, an oxide layer with a thickness of 2500 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 140 adjacent to the sidewalls of gates 114, 116 and 118, and removes portions of gate oxide 110 outside gates 114, 116 and 118 and spacers 140. Spacers 140 cover portions of lightly doped source/drain regions 134, 136 and 138.

Figure 1H:
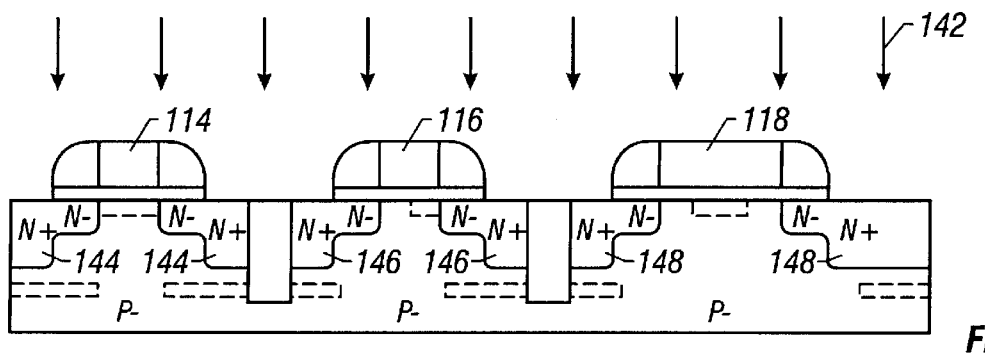

In FIG. 1H, heavily doped source and drain regions are implanted into the device regions by subjecting the structure to ion implantation of phosphorus, indicated by arrows 142, at a dose in the range of $1\times10^{15}$ to $5\times10^{15}$ atoms/cm$^2$ and an energy of about 40 to 50 kiloelectron-volts, using gates 114, 116 and 118 as well as spacers 140 as an implant mask. As a result, heavily doped source/drain regions 144 are implanted into device region 104 and are self-aligned to the outside edges of spacers 140 adjacent to gate 114, heavily doped source/drain regions 146 are implanted into device region 106 and are self-aligned to the outside edges of spacers 140 adjacent to gate 116, and heavily doped source/drain regions 148 are implanted into device region 108 and are self-aligned to the outside edges of spacers 140 adjacent to gate 118. Heavily doped source/drain regions 144, 146 and 148 are doped N+ with an phosphorus concentration in the range of about $1\times10^{18}$ to $1\times10^{20}$ atoms/cm$^3$.

Thereafter, the structure is annealed to remove crystalline damage and to drive-in and activate the implanted dopants by applying a rapid thermal anneal on the order of 950 to 1050° C. for 10 to 30 seconds. This forms the sources and drains, consisting of lightly and heavily doped source/drain regions 134 and 144 in device region 104, lightly and heavily doped source/drain regions 136 and 146 in device region 106, and lightly and heavily doped source/drain regions 138 and 148 in device region 108, for enhancement-mode N-channel IGFETs controlled by gates 114, 116 and 118, respectively.

Of importance, the channel regions in device regions 106 and 108 have non-uniform lateral doping profiles. That is, the channel doping changes as a function of lateral distance along the channel region between the source and the drain. For example, in device region 106, the channel doping increases inside threshold adjust region 126 and decreases outside threshold adjust region 126. Thus, the channel doping is considerably higher at the left channel junction than at the right channel junction. This contrasts with device region 104, in which the lateral doping profile is uniform throughout the channel region.

Furthermore, the implanted regions of the threshold adjust implant, depicted by the broken lines, that are in the substrate but outside the channel regions, are far deeper than the channel regions, sources and drains, and therefore do not adversely affect device performance.

FIGS. 2A–2H show cross-sectional views of successive process steps for making an IGFET with a non-uniform lateral doping profile in the channel region in accordance with a second embodiment of the invention. In the first embodiment, the threshold adjust implant has the same conductivity type as the channel region, and therefore increases the doping concentration of a selected portion of the channel region. As another approach, in the second embodiment, the threshold adjust implant has the opposite conductivity type as the channel region, and therefore counterdopes and decreases the doping concentration of a selected portion of the channel region. Unless otherwise noted, the elements for the second embodiment (e.g., trench oxides 202, gate oxide 210, etc.) are similar to elements of the first embodiment (e.g., trench oxides 202, gate oxide 110, etc.), and the description of related elements and process steps need not be repeated.

Figure 2A:
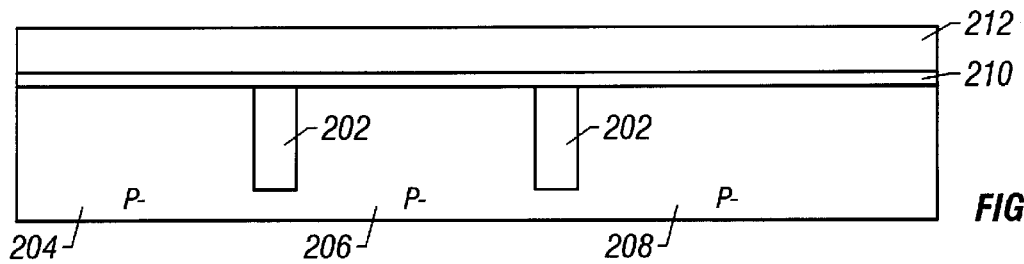
FIGS. 2A–2H show cross-sectional views of successive process steps for making an IGFET with a non-uniform lateral doping profile in the channel region in accordance with a second embodiment of the invention.

In FIG. 2A, a silicon substrate suitable for integrated circuit manufacture is provided. The substrate includes a P-type epitaxial surface layer with a planar top surface disposed on a P+ base layer (not shown). The epitaxial surface layer has a boron background concentration on the order of $1 \times 10^{16}$ atoms/cm$^3$, a <100> orientation and a resistivity of 12 ohm-cm. The epitaxial surface layer is subjected to a threshold adjust implant of boron at a dose in the range of about $4 \times 10^{12}$ to $9 \times 10^{12}$ atoms/cm$^2$ and an energy of about 5 kiloelectron-volts to provide a boron concentration at or near the top surface of about $5 \times 10^{16}$ to $5 \times 10^{17}$ atoms/cm$^3$. (This initial threshold adjust implant prior to gate formation is not performed in the first embodiment). If desired, the epitaxial surface layer can also be subjected to a well implant and/or punchthrough implant. Trench oxides 202 provide dielectric isolation between devices regions 204, 206 and 208 in the substrate. A blanket layer of gate oxide 210, with a thickness in the range of 30 to 60 angstroms, is formed on the top surface of the substrate, and then undoped polysilicon layer 212 is deposited by low pressure chemical vapor deposition on the top surface of gate oxide 210.

Figure 2B:
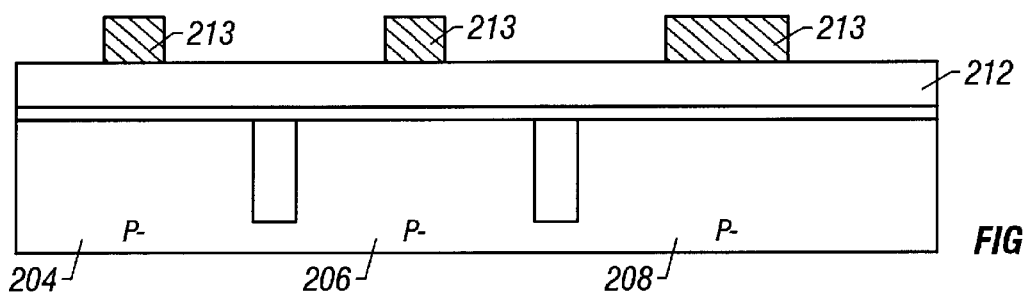

In FIG. 2B, photoresist layer 213 is deposited on polysilicon layer 212, selectively irradiated, and the irradiated portions are removed so that photoresist layer 213 includes openings above selected portions of device regions 204, 206 and 208.

Figure 2C:
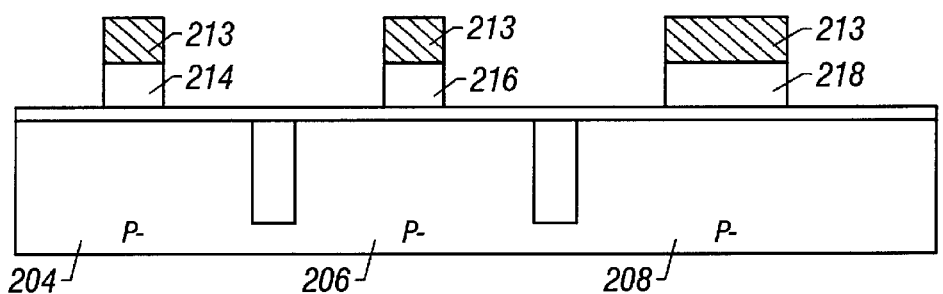

In FIG. 2C, an anisotropic dry etch is applied using photoresist layer 213 as an etch mask. The etch removes portions of polysilicon layer 212 beneath the openings in photoresist layer 213 and forms gates 214, 216 and 218 from the unetched portions of polysilicon layer 212 over device regions 204, 206 and 208, respectively.

Figure 2D:
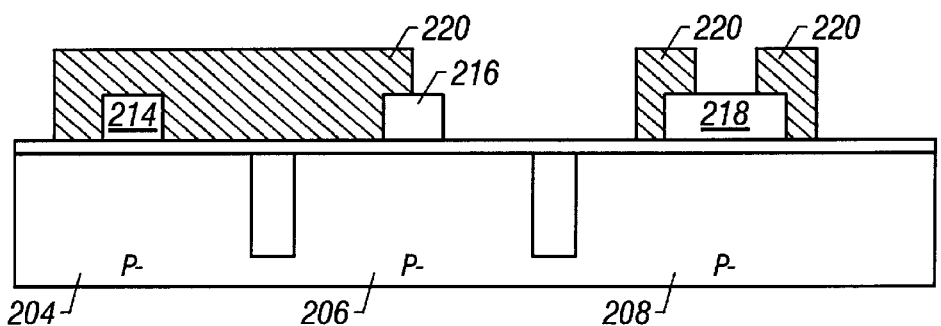

In FIG. 2D, photoresist layer 213 is stripped, and photoresist layer 220 is deposited over the substrate, selectively irradiated, and the irradiated portions are removed so that photoresist layer 220 includes openings above selected portions of device regions 204, 206 and 208. In particular, photoresist layer 220 covers a portion of device region 204 outside gate 214, the entire gate 214, a portion of device region 206 outside gate 216, a portion of gate 216 that includes its left sidewall, a portion of device region 208 outside gate 218, and a portion of gate 218 that includes its sidewall. Furthermore, photoresist layer 220 includes openings above a portion of device region 204 outside gate 214, a portion of device region 206 outside gate 216, a portion of gate 216 that includes its right sidewall, a portion of device region 208 outside gate 218, and a portion of gate 218 between and spaced from its sidewalls.

Figure 2E:
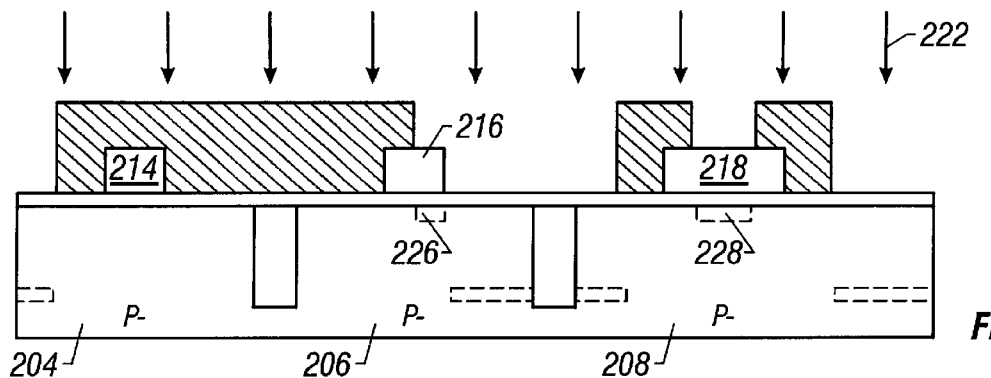

In FIG. 2E, a threshold adjust implant is applied by subjecting the structure to phosphorus, indicated by arrows 222, at a dose of about $2 \times 10^{12}$ atoms/cm$^2$ and an energy of about 200 kiloelectron-volts. Essentially none of the phosphorus that impinges upon photoresist layer 220 or trench oxides 202 is implanted therethrough. Essentially all of the phosphorus that impinges upon the uncovered portions of the device regions outside the gates is implanted into those portions of the device regions, far below the top surface of the substrate, to a depth that is similar to the thickness of the gates. Most of the phosphorus that impinges upon the uncovered portions of the gates is implanted through those portions of the gates, and through portions of the underlying gate oxide 210 into portions of the underlying channel regions in the respective device regions, at or near the top surface of the substrate. The regions of the substrate in which the phosphorus is implanted are depicted by the broken lines. These regions, which are highly localized both vertically and laterally, include threshold adjust regions 226 and 228 in the channel regions in device regions 206 and 208, respectively. Threshold adjust regions 226 and 228 do not have a sufficient phosphorus concentration to become N-type, but rather, remain P-type with, a net P-type doping concentration that is reduced to the range of about $1 \times 10^{16}$ to $5 \times 10^{16}$ atoms/cm$^3$.

Threshold adjust region 226 occupies about 50% of the channel region in device region 206 (aligned with the right sidewall of gate 216), and threshold adjust region 228 occupies about 50% of the channel region in device region 208 (equally spaced between the sidewalls of gate 218). The threshold adjust regions decrease the net doping concentrations in the channel regions in device regions 206 and 208. Furthermore, since the threshold adjust regions decrease the channel doping in device region 206 without affecting the channel doping in device region 204 (which remains relatively high), the IGFET to be fabricated in device region 206 shall have a lower threshold voltage, and therefore a higher drain current and leakage current, than the IGFET to be fabricated in device region 204.

Figure 2F:
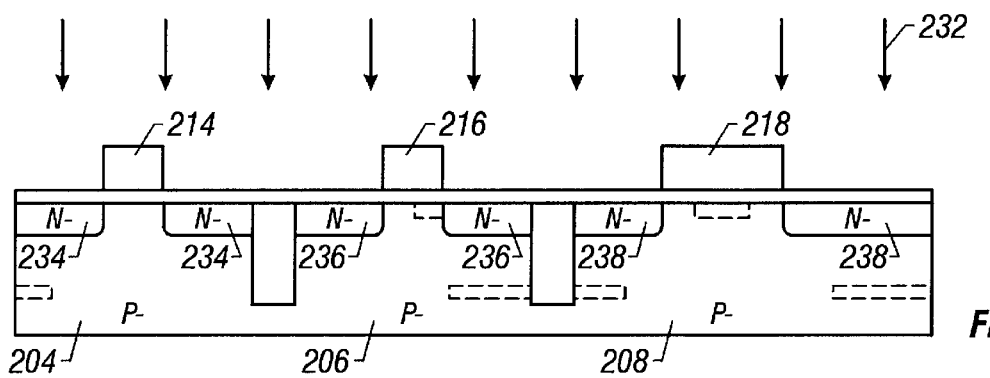

In FIG. 2F, photoresist layer 220 is stripped, and lightly doped source and drain regions are implanted into the device regions by subjecting the structure to ion implantation of phosphorus, indicated by arrows 232, at a dose in the range of $1 \times 10^{13}$ to $5 \times 10^{14}$ atoms/cm$^2$ and an energy of 30 to 45 kiloelectron-volts, using gates 214, 216 and 218 as an implant mask. Lightly doped source/drain regions 234, 236 and 238 are implanted into device regions 204, 206 and 208, respectively, and are doped N− with an phosphorus concentration in the range of about $1 \times 10^{17}$ to $1 \times 10^{18}$ atoms/cm$^3$.

Figure 2G:
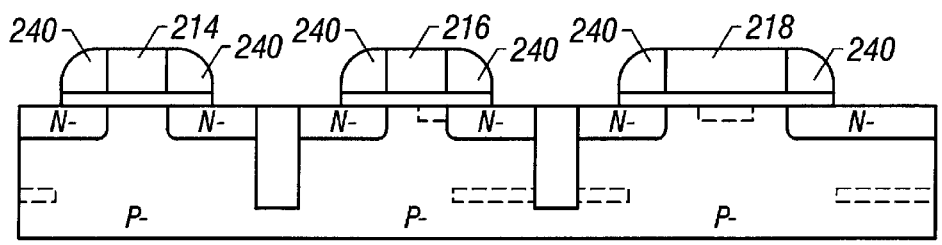

In FIG. 2G, an oxide layer is conformally deposited over the exposed surfaces, and thereafter, the structure is subjected to an anisotropic reactive ion etch that forms oxide spacers 240 adjacent to the sidewalls of gates 214, 216 and 218.

Figure 2H:
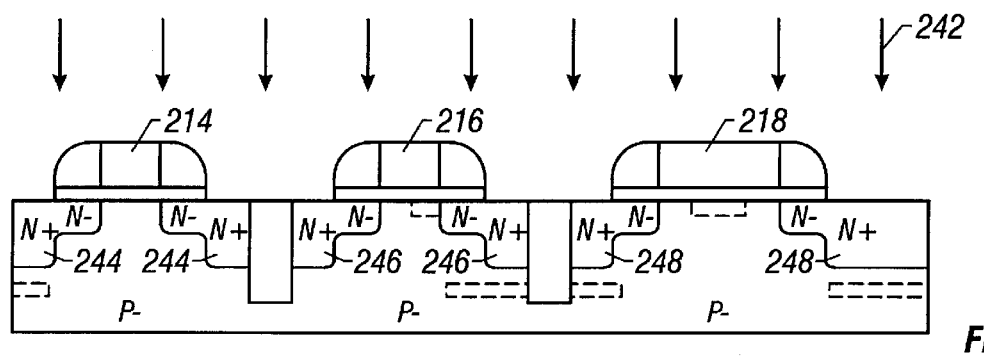

In FIG. 2H, heavily doped source and drain regions are implanted into the device regions by subjecting the structure to ion implantation of phosphorus, indicated by arrows 242, at a dose in the range of $1 \times 10^{15}$ to $5 \times 10^{15}$ atoms/cm$^2$ and an energy of about 40 to 50 kiloelectron-volts, using gates 214, 216 and 218 as well as spacers 240 as an implant mask. As a result, heavily doped source/drain regions 244, 246 and 248 are implanted into device regions 204, 206 and 208, respectively, and are doped N+ with an phosphorus concentration in the range of about $1 \times 10^{18}$ to $1 \times 10^{20}$ atoms/cm$^3$.

Thereafter, the structure is annealed to remove crystalline damage and to drive-in and activate the implanted dopants by applying a rapid thermal anneal on the order of 950 to 1050° C. for 10 to 30 seconds. This forms the sources and drains, consisting of lightly and heavily doped source/drain regions 234 and 244, 236 and 246, and 238 and 248 in device regions 204, 206 and 208, respectively, for enhancement-mode N-channel IGFETs controlled by gates 214, 216 and 218, respectively.

The channel regions in device regions 206 and 208 have non-uniform lateral doping profiles, unlike the channel region in device region 204 which has a uniform lateral doping profile. Furthermore, the implanted regions of the threshold adjust implant, depicted by the broken lines, in the substrate but outside the channel regions, are far deeper than the channel regions, sources and drains, and therefore do not adversely affect device performance.

FIGS. 3A–3I show cross-sectional views of successive process steps for making an IGFET with a non-uniform lateral doping profile in the channel region in accordance with a third embodiment of the invention. In the first embodiment, the IGFETs are all symmetrical devices with similar source/drain doping characteristics. As another approach, in the third embodiment an asymmetrical device is fabricated in which the source includes a heavily doped source region that provides a channel junction and the drain includes a lightly doped drain region that provides another channel junction. During fabrication of the asymmetrical device, the masking layer completely covers a drain region of a device region without covering a source region of the device region so that the masking layer provides an implant mask for another dopant that provides substantial doping for the source without providing essentially any doping for the drain. Unless otherwise noted, the elements for the third embodiment (e.g., trench oxides 302, gate oxide 310, etc.) are similar to elements of the first embodiment (e.g., trench oxides 102, gate oxide 110, etc.), and the description of related elements and process steps need not be repeated.

Figure 3A:
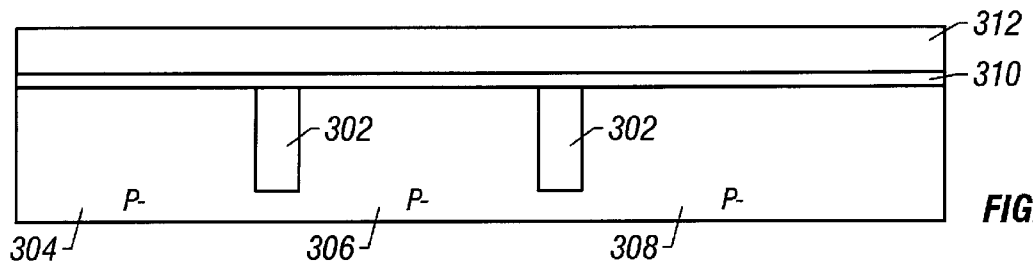
FIGS. 3A–3I show cross-sectional views of successive process steps for making an IGFET with a non-uniform lateral doping profile in the channel region in accordance with a third embodiment of the invention.

In FIG. 3A, a silicon substrate suitable for integrated circuit manufacture is provided. The substrate includes a P−type epitaxial surface layer with a planar top surface disposed on a P+ base layer (not shown). The epitaxial surface layer has a boron background concentration on the order of $1 \times 10^{16}$ atoms/cm$^3$, a <100> orientation and a resistivity of 12 ohm-cm. If desired, the epitaxial surface layer can be subjected to a well implant and/or punchthrough implant. Trench oxides 302 provide dielectric isolation between devices regions 304, 306 and 308 in the substrate. A blanket layer of gate oxide 310, with a thickness in the range of 30 to 60 angstroms, is formed on the top sur face of the substrate, and then undoped polysilicon layer 312 is deposited by low pressure chemical vapor deposition on the top surface of gate oxide 310.

Figure 3B:
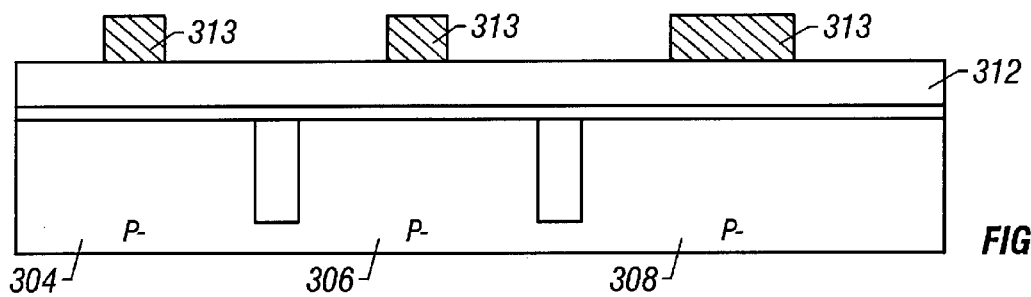

In FIG. 3B, photoresist layer 313 is deposited on polysilicon layer 312, selectively irradiated, and the irradiated portions are removed so that photoresist layer 313 includes openings above selected portions of device regions 304, 306 and 308.

Figure 3C:
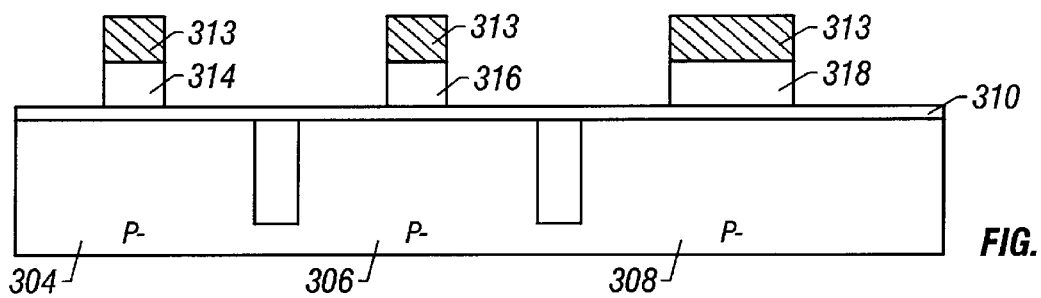

In FIG. 3C, an anisotropic dry etch is applied using photoresist layer 313 as an etch mask. The etch removes portions of polysilicon layer 312 beneath the openings in photoresist layer 313 and forms gates 314, 316 and 318 from the unetched portions of polysilicon layer 312 over device regions 304, 306 and 308, respectively.

Figure 3D:
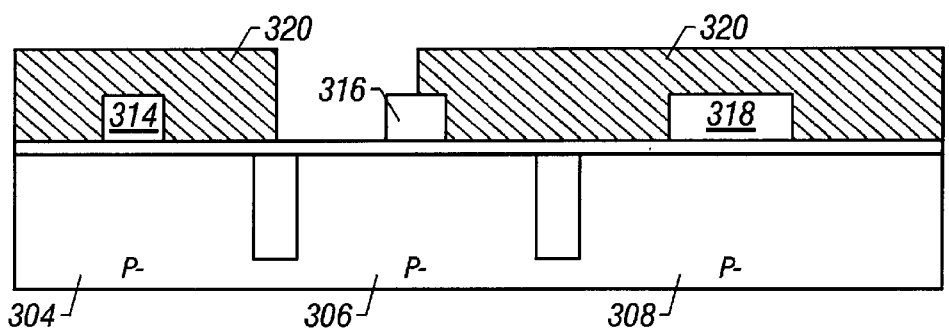

In FIG. 3D, photoresist layer 313 is stripped, and photoresist layer 320 is deposited over the substrate, selectively irradiated, and the irradiated portions are removed so that photoresist layer 320 includes an opening above a selected portion of device region 306. In particular, photoresist layer 320 covers the entire device region 304 and gate 314, the entire device region 308 and gate 318, a portion of device region 306 outside gate 316 and a portion of gate 316 that includes its right sidewall. Furthermore, photoresist layer 320 includes an opening above a portion of device region 306 outside gate 316 and a portion of gate 316 that includes its left sidewall.

Figure 3E:
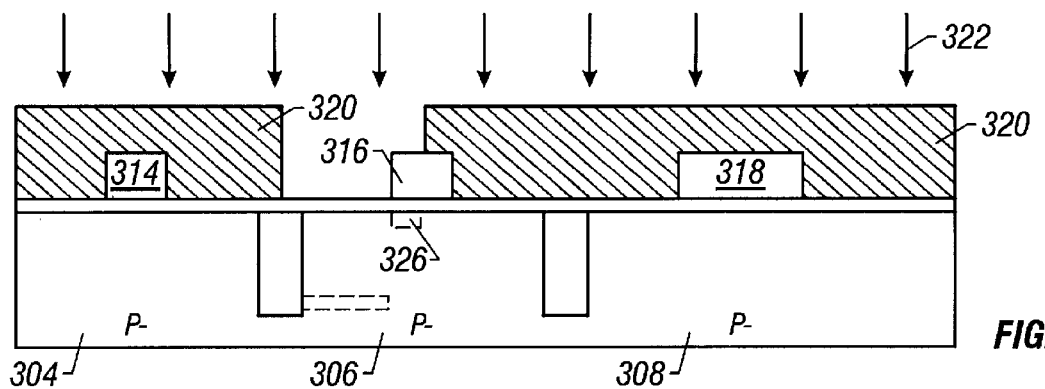

In FIG. 3E, a threshold adjust implant is applied by subjecting the structure to ion implantation of boron, indicated by arrows 322, at a dose in the range of $4 \times 10^{12}$ to $9 \times 10^{12}$ atoms/cm$^2$ and an energy of about 65 kiloelectron-volts. Essentially none of the boron that impinges upon photoresist layer 320 or trench oxides 302 is implanted therethrough. Essentially all of the boron that impinges upon the uncovered portion of device region 306 outside gate 316 is implanted far below the top surface of the substrate, to a depth that is similar to the thickness of gate 316. Most of the boron that impinges upon the uncovered portion of gate 316 is implanted therethrough and through portions of the underlying gate oxide 310 into portions of the underlying channel region in device region 306, at or near the top surface of the substrate. The regions of the substrate in which the boron is implanted are depicted by the broken lines. These regions, which are highly localized both vertically and laterally, include threshold adjust region 326 in the channel region in device region 306, with a boron concentration in the range of about $5 \times 10^{16}$ to $5 \times 10^{17}$ atoms/cm$^2$.

Threshold adjust region 326 occupies about 50% of the channel region in device region 326 (aligned with the right sidewall of gate 326). Thus, the boron increases the net doping concentration in the channel region in device region 306. Since the threshold adjust implant does not affect the channel doping in device region 304, the IGFET to be fabricated in device region 304 shall have a lower threshold voltage, and therefore a higher drain current and leakage current, than the IGFET to be fabricated in device region 306.

Figure 3F:
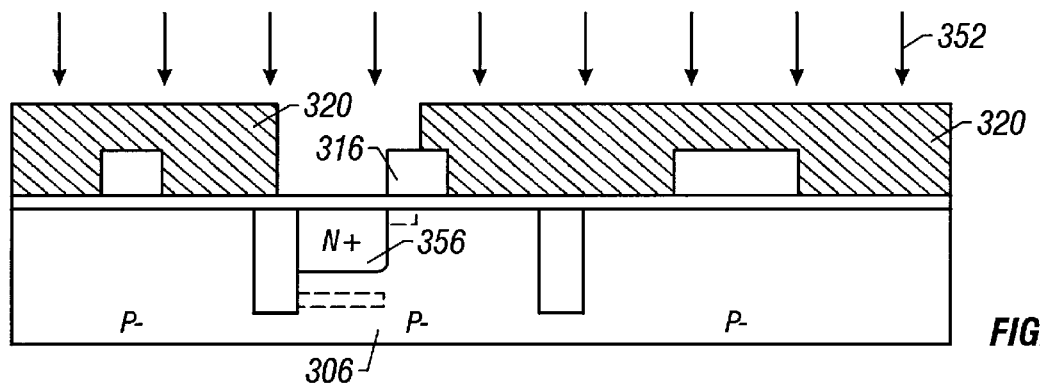

In FIG. 3F, a heavily doped source region is implanted into device region 306 by subjecting the structure to ion implantation of phosphorus, indicated by arrows 352, at a dose in the range of $1 \times 10^{15}$ to $5 \times 10^{15}$ atoms/cm$^2$ and an energy of about 40 to 50 kiloelectron-volts, using gate 316 as well as photoresist layer 320 as an implant mask. (This source-only implant using the masking layer as an implant mask is not performed in the first embodiment). As a result, heavily doped source region 356 is implanted into device region 306 and is self-aligned to the left sidewall of gate 316. Heavily doped source region 356 is doped N+ with an phosphorus concentration in the range of about $1 \times 10^{18}$ to $1 \times 10^{20}$ atoms/cm$^3$. Accordingly, photoresist layer 320 provides an implant mask both for selectively doping a portion of the channel region in device region 306, and for providing asymmetrical source/drain doping in device region 306.

Figure 3G:
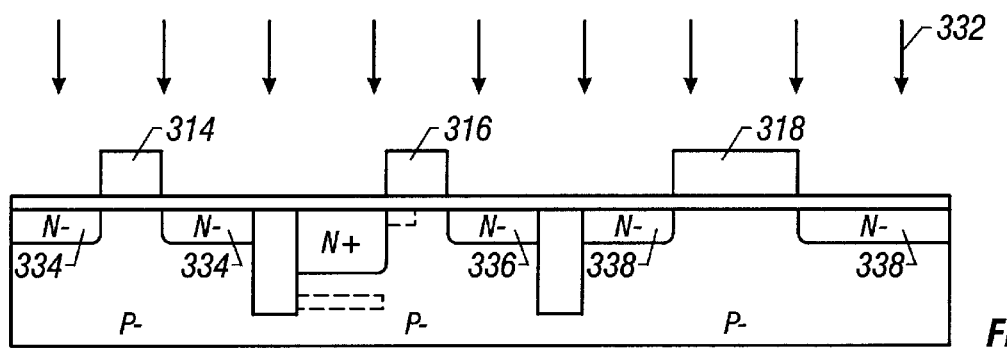

In FIG. 3G, photoresist layer 320 is stripped, a lightly doped drain region is implanted into device region 306, and lightly doped source/drain regions are implanted into device regions 304 and 308 by subjecting the structure to ion implantation of phosphorus, indicated by arrows 332, at a dose in the range of $1 \times 10^{13}$ to $5 \times 10^{14}$ atoms/cm$^2$ and an energy of 30 to 45 kiloelectron-volts, using gates 314, 316 and 318 as an implant mask. As a result, lightly doped source/drain regions 334 are self-aligned to the sidewalls of gate 314, lightly doped drain region 336 is self-aligned to the right sidewall of gate 316, and lightly doped source/drain regions 338 are self-aligned to the sidewalls of gate 318. Lightly doped source/drain regions 334, drain region 336 and source/drain regions 338 are doped N− with an phosphorus concentration in the range of about $1 \times 10^{17}$ to $1 \times 10^{18}$ atoms/cm$^3$.

Figure 3H:
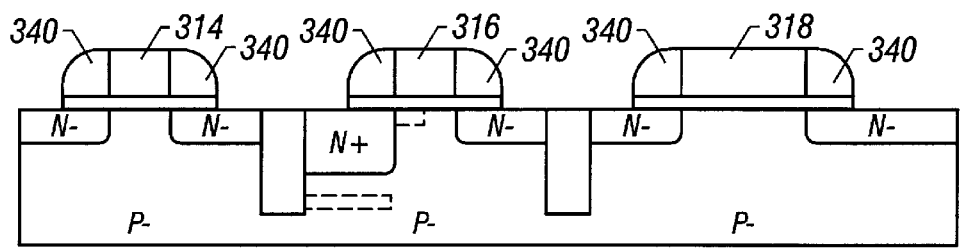

In FIG. 3H, an oxide layer is conformally deposited over the exposed surfaces, and thereafter, the structure is subjected to an anisotropic reactive ion etch that forms oxide spacers 340 adjacent to the sidewalls of gates 314, 316 and 318.

Figure 3I:
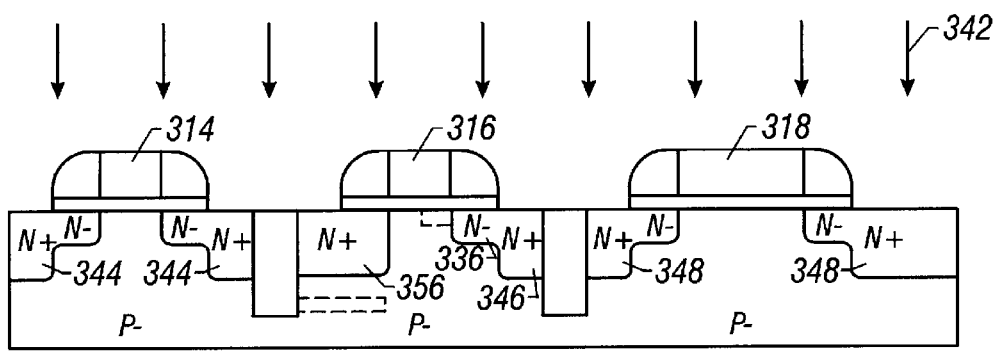

In FIG. 3I, a heavily doped drain region is implanted into device region 306 and heavily doped source/drain regions are implanted into device regions 304 and 308 by subjecting the structure to ion implantation of phosphorus, indicated by arrows 342, at a dose in the range of $1 \times 10^{15}$ to $5 \times 10^{15}$ atoms/cm$^2$ and an energy of about 40 to 50 kiloelectron-volts, using gates 314, 316 and 318 as well as spacers 340 as an implant mask. Heavily doped source/drain regions 344, drain region 346 and source/drain regions 348 are implanted into device regions 304, 306 and 308, respectively, and are doped N+ with an phosphorus concentration in the range of about $1 \times 10^{18}$ to $1 \times 10^{20}$ atoms/cm$^3$.

Thereafter, the structure is annealed to remove crystalline damage and to drive-in and activate the implanted dopants by applying a rapid thermal anneal on the order of 950 to 1050° C. for 10 to 30 seconds. This forms the sources and drains in device regions 304, 306 and 308 for enhancement-mode N-channel IGFETs controlled by gates 314, 316 and 318, respectively.

The channel region in device region 306 has a non-uniform lateral doping profile, unlike the channel regions in device regions 304 and 308 which have uniform lateral doping profiles. The implanted region of the threshold adjust implant, depicted by the broken lines, that is in device region 306 but outside the channel region, is far deeper than the channel region, source and drain in device region 306, and therefore does not adversely affect device performance. Furthermore, since heavily doped source region 356 in device region 306 provides a channel junction, and lightly doped drain region 336 in device region 306 provides another channel junction, the IGFET in device region 306 is an asymmetrical device.

FIGS. 4A–4I show cross-sectional views of successive process steps for making an IGFET with a non-uniform lateral doping profile in the channel region in accordance with a fourth embodiment of the invention. In the first embodiment, the threshold adjust region is implanted into the channel region. As another approach, in the fourth embodiment, the dopant is implanted into a portion of the gate, then diffused from the gate into a threshold adjust region in the channel region. A well-known problem encountered in P-channel devices with polysilicon gates containing a high concentration of boron is that when a thin gate oxide is used, poor threshold voltage control may arise due to unwanted boron penetration into the gate oxide, or further, into the underlying channel region. In conventional processes, boron penetration is usually considered problematic, and attempts are made to reduce or eliminate it. In the fourth embodiment, boron penetration is used to provide the threshold adjust region in a selected portion of the channel region. Furthermore, in the fourth embodiment, unlike the first embodiment, the IGFET is a P-channel device, and the source and drain are partially formed before introducing the threshold adjust region into the channel region. Unless otherwise noted, the elements for the fourth embodiment (e.g., trench oxides 402, gate oxide 410, etc.) are similar to elements of the first embodiment (e.g., trench oxides 102, gate oxide 110, etc.), and the description of related elements and process steps need not be repeated.

Figure 4A:
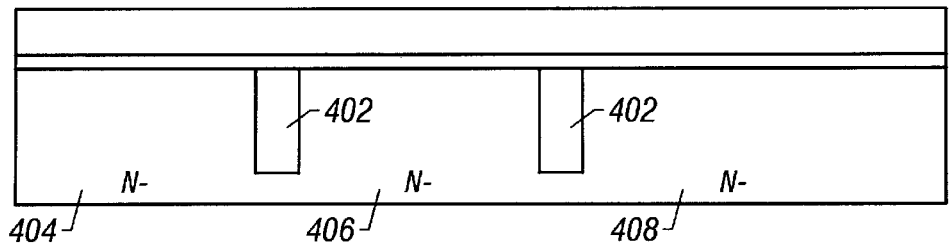

In FIG. 4A, a silicon substrate suitable for integrated circuit manufacture is provided. The substrate includes a P− type epitaxial surface layer with a planar top surface disposed on a P+ base layer (not shown). An upper portion of the epitaxial surface layer, which is shown, is subjected to an N-type well implant, and has an arsenic background concentration on the order of $1 \times 10^{16}$ atoms/cm$^3$, a <100> orientation and a resistivity of 12 ohm-cm. (An N-type well implant is not used in the first embodiment.) The epitaxial surface layer is also subjected to a threshold adjust implant of phosphorus at a dose in the range of about $4 \times 10^{12}$ to $9 \times 10^{12}$ atoms/cm$^2$ and an energy of about 5 kiloelectron-volts to provide a phosphorus concentration at or near the top surface of about $5 \times 10^{16}$ to $5 \times 10^{17}$ atoms/cm$^3$. (This initial threshold adjust implant prior to gate formation is not performed in the first embodiment). If desired, the epitaxial surface layer can also be subjected to a punchthrough implant. Trench oxides 402 provide dielectric isolation between devices regions 404, 406 and 408 in the substrate. A blanket layer of gate oxide 410, with a thickness in the range of 30 to 60 angstroms, is formed on the top surface of the substrate, and then undoped polysilicon layer 412 is deposited by low pressure chemical vapor deposition on the top surface of gate oxide 410.

Figure 4B:
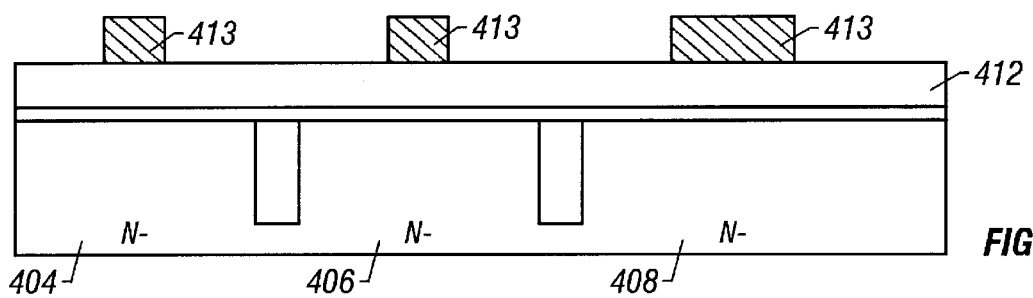

In FIG. 4B, photoresist layer 413 is deposited on polysilicon layer 412, selectively irradiated, and the irradiated portions are removed so that photoresist layer 413 includes openings above selected portions of device regions 404, 406 and 408.

Figure 4C:
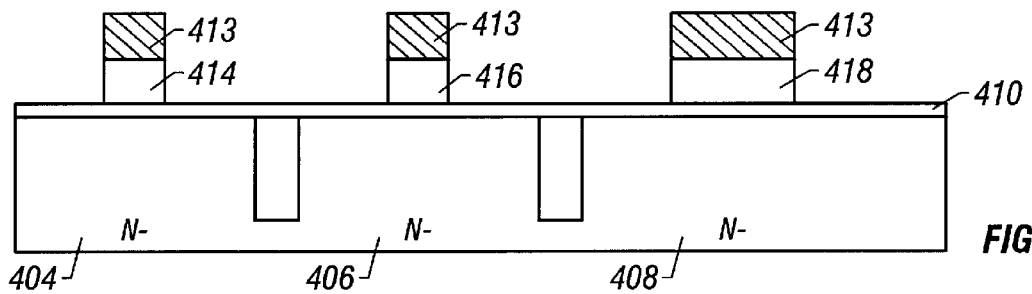

In FIG. 4C, an anisotropic dry etch is applied using photoresist layer 413 as an etch mask. The etch removes portions of polysilicon layer 413 beneath the openings in photoresist layer 413 and forms gates 414, 416 and 418 from the unetched portions of polysilicon layer 412 over device regions 404, 406 and 408, respectively.

Figure 4D:
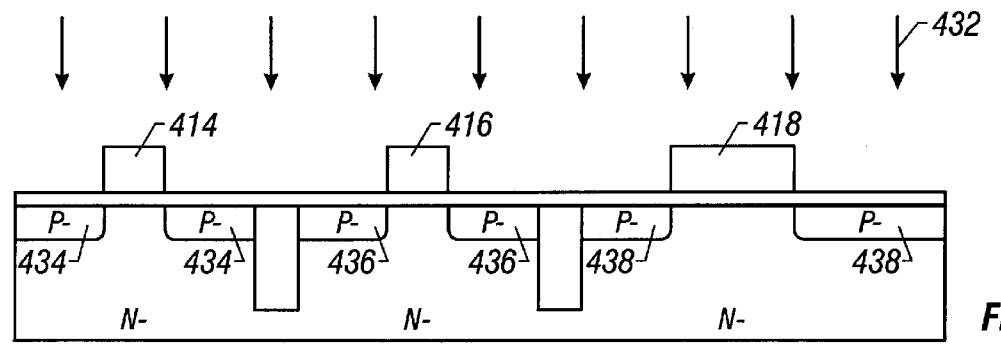

In FIG. 4D, photoresist layer 413 is stripped, and lightly doped source and drain regions are implanted into the device regions by subjecting the structure to ion implantation of boron difluoride (BF$_2$), indicated by arrows 432, at a dose in the range of $1 \times 10^{13}$ to $5 \times 10^{14}$ atoms/cm$^2$ and an energy of 10 to 50 kiloelectron-volts, using gates 414, 416 and 48 as an implant mask. Lightly doped source/drain regions 434, 436 and 438 are implanted into device regions 404, 406 and 408, respectively, and are doped P− with a boron concentration in the range of about $1 \times 10^{17}$ to $1 \times 10^{18}$ atoms/cm$^3$.

Figure 4E:
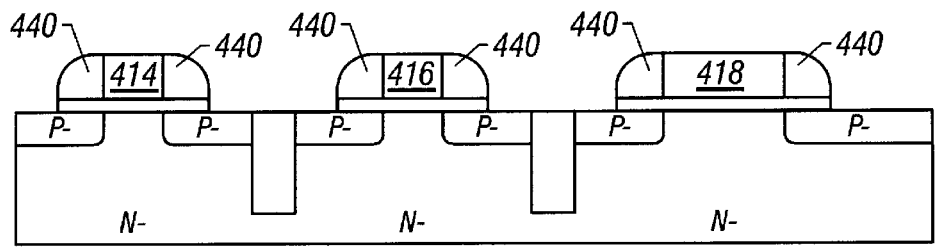

In FIG. 4E, an oxide layer is conformally deposited over the exposed surfaces, and thereafter, the structure is subjected to an anisotropic reactive ion etch that forms oxide spacers 440 adjacent to the sidewalls of gates 414, 416 and 418.

Figure 4F:
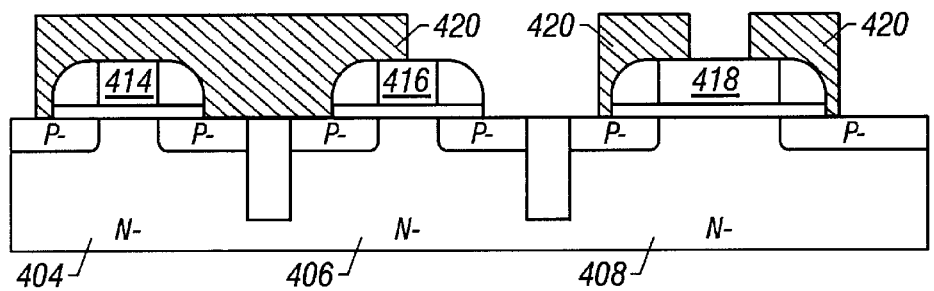

In FIG. 4F, photoresist layer 420 is deposited over the substrate, selectively irradiated, and the irradiated portions are removed so that photoresist layer 420 includes openings above selected portions of device regions 404, 406 and 408. In particular, photoresist layer 420 covers a portion of device region 404 outside gate 414, the entire gate 414, a portion of device region 406 outside gate 416, a portion of gate 416 that includes its left sidewall, a portion of device region 408 outside gate 418, and a portion of gate 418 that includes its sidewalls. Furthermore, photoresist layer 420 includes openings above a portion of device region 404 outside gate 414, a portion of device region 406 outside gate 416, a portion of gate 416 that includes its right sidewall, a portion of device region 408 outside gate 418, and a portion of gate 418 between and spaced from its sidewalls.

Figure 4G:
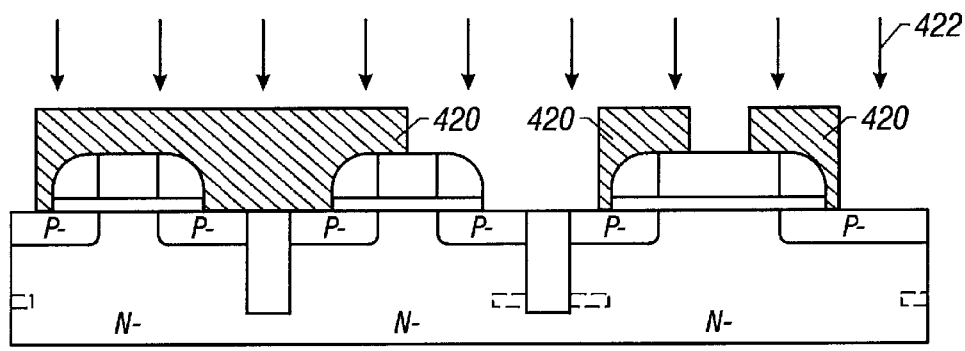

In FIG. 4G, a threshold adjust implant is applied by subjecting the structure to ion implantation of boron, indicated by arrows 422, at a dose in the range of $1 \times 10^{15}$ to $5 \times 10^{15}$ atoms/cm$^2$ and an energy of about 40 kiloelectron-volts. Essentially none of the boron that impinges upon photoresist layer 420 or trench oxides 402 is implanted therethrough. Essentially all of the boron that impinges upon the uncovered portions of the device regions is implanted into those portions of the device regions, far below the top surface of the substrate, to a depth that is slightly less than the thickness of the gates. Most of the boron that impinges upon the uncovered portions of the gates is implanted into the gates, with a peak concentration near the gate oxide interface.

The regions of the substrate in which the boron is implanted are depicted by the broken lines. These regions, which are highly localized both vertically and laterally, are outside the gates, and therefore do not affect the channel regions in device regions 406 and 408, respectively. These regions have a sufficient boron concentration to become P-type.

Figure 4H:
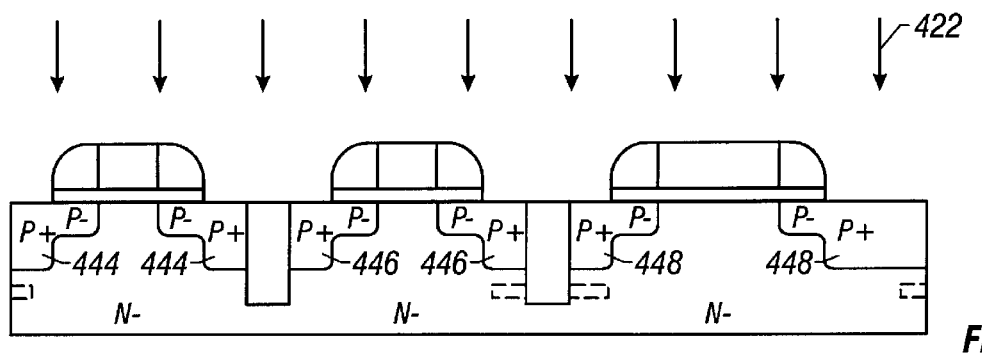
Figure 41:
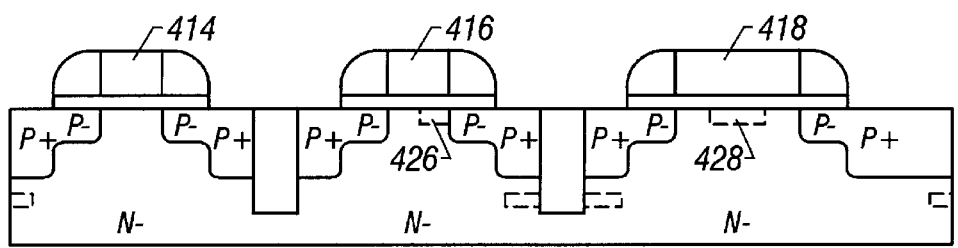

In FIG. 4H, photoresist layer 420 is stripped, and heavily doped source and drain regions are implanted into the device regions by subjecting the structure to ion implantation of $BF_2$, indicated by arrows 442, at a dose in the range of $1\times10^{15}$ to $5\times10^{15}$ atoms/cm² and an energy of about 10 to 50 kiloelectron-volts, using gates 414, 416 and 418 as well as spacers 440 as an implant mask. As a result, heavily doped source/drain regions 444, 446 and 448 are implanted into device regions 404, 406 and 408, respectively, and are doped P+ with a boron concentration in the range of about $1\times10^{18}$ to $1\times10^{20}$ atoms/cm³.

In FIG. 4I, the structure is annealed to remove crystalline damage and to drive-in and activate the implanted dopants by applying a rapid thermal anneal on the order of 900 to 1050° C. for 10 to 30 seconds. This forms the sources and drains in device regions 404, 406 and 408 for enhancement-mode P-channel IGFETs controlled by gates 414, 416 and 418, respectively.

Moreover, the anneal causes a substantial amount of the boron, supplied by the threshold adjust implant indicated by arrows 422, and implanted deeply into selected portions of gates 416 and 418, to diffuse from these portions of gates 416 and 418 through gate oxide 410 into threshold adjust regions 426 and 428, respectively, in the channel regions in device regions 406 and 408, respectively. Threshold adjust regions 426 and 428 do not have a sufficient boron concentration to become P-type, but rather, remain N-type, with a net N-type doping concentration that is reduced to the range of about $1\times10^{16}$ to $5\times10^{16}$ atom/cm³.

Threshold adjust region 426 occupies about 50% of the channel region in device region 406 (aligned with the right sidewall of gate 416), and threshold adjust region 428 occupies about 50% of the channel region in device region 408 (equally spaced between the sidewalls of gate 418). The threshold adjust regions decrease the net doping concentrations in the channel regions in device regions 406 and 408. Furthermore, since the threshold adjust regions decrease the channel doping in device region 406 without affecting the channel doping in device region 404 (which remains relatively high), the IGFET in device region 406 has a lower threshold voltage, and therefore a higher drain current and leakage current, than the IGFET in device region 404.

The channel regions in device regions 406 and 408 have non-uniform lateral doping profiles, unlike the channel region in device region 404 which has a uniform lateral doping profile. Furthermore, the implanted regions of the threshold adjust implant, depicted by the broken lines, in the substrate but outside the channel regions, are far deeper than the channel regions, sources and drains, and therefore do not adversely affect device performance.

Further processing steps in the fabrication of IGFETs typically include forming salicide contacts on the gates, sources and drains, forming a thick oxide layer over the device regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional. Likewise the principal processing steps disclosed herein may be combined with other steps apparent to those skilled in the art.

The present invention includes numerous variations to the embodiments described above. For instance, gates can include various conductors such as polysilicon, epitaxial silicon, conductive metals, and conductive metal silicides. The gate insulator and spacers can be various dielectrics such as silicon dioxide, silicon nitride and silicon nitride. The device regions can be isolated using various techniques such as LOCOS oxidation, and adjacent device regions need not necessarily be isolated from one another. Various masking layers, patterned by overlying photoresist layers, can be used as an etch mask and/or implant mask. The threshold adjust implant can be applied either before or after forming the source and drain. The masking layer can be patterned to provide a wide range of channel doping throughout an integrated circuit chip; for instance, the masking layer can cover one-quarter, one-half, three-quarters, and all of various gates, thereby providing four levels of threshold voltage, drive current and leakage current. Furthermore, various features of the embodiments described above can be combined with others; for instance, an asymmetrical device (third embodiment) can be formed with a selected portion of the channel region being counterdoped (second embodiment). Suitable N-type dopants include arsenic and phosphorus (although it may be difficult to diffuse any appreciable amount of arsenic or phosphorus through the gate insulator); suitable P-type dopants include boron $B_{10}$, boron $B_{11}$, and $BF_X$ species such as $BF_2$.

The invention is particularly well-suited for fabricating N-channel MOSFETs, P-channel MOSFETs and other types of IGFETs, particularly for high-performance microprocessors where high circuit density is essential. Although a few devices have been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET, comprising:

providing a semiconductor substrate with a device region;

forming a gate over the device region;

forming a masking layer that partially covers the gate and the device region;

implanting a dopant into portions of the gate and the device region outside the gate that are not covered by the masking layer, wherein implanting the dopant excludes implanting essentially any of the dopant through the uncovered portion of the gate into the portion of the channel region;

transferring the dopant through the uncovered portion of the gate into a portion of an underlying channel region in the device region, thereby providing the channel region with a non-uniform lateral doping profile and adjusting a threshold voltage, wherein transferring the dopant includes applying a thermal cycle to diffuse the dopant from the uncovered portion of the gate into the portion of the channel region; and forming a source and a drain in the device region.

2. The method of claim 1, wherein the gate includes first and second opposing sidewalls, the masking layer covers the first sidewall and the uncovered portion of the gate includes the second sidewall.

3. The method of claim 1, wherein the gate includes first and second sidewalls, the masking layer covers the first and second sidewalls and the uncovered portion of the gate is between and spaced from the first and second sidewalls.

4. The method of claim 1, wherein the dopant and the channel region are a first conductivity type, and the dopant increases a doping concentration of the portion of the channel region thereby adjusting the threshold voltage away from zero.

5. The method of claim 1, wherein the dopant and the channel region are opposite conductivity types, and the dopant decreases a doping concentration of the portion of the channel region thereby adjusting the threshold voltage towards zero.

6. The method of claim 1, wherein the source and the drain are substantially aligned with opposing sidewalls of the gate.

7. The method of claim 1, including implanting the dopant before forming the source and the drain.

8. The method of claim 1, including implanting the dopant after forming the source and the drain.

9. The method of claim 1, including implanting a second dopant into the portion of the device region without implanting essentially any of the second dopant into another portion of the device region that is outside the gate and covered by the masking layer, such that the second dopant provides substantial doping for the source without providing essentially any doping for the drain.

10. The method of claim 9, wherein the source includes a heavily doped source region that provides a channel junction, and the drain includes a lightly doped drain region that provides another channel junction.

11. The method of claim 1, wherein essentially all of the dopant in the portion of the device region has a substantially greater depth than that of the channel region.

12. The method of claim 1, wherein essentially all of the dopant in the portion of the device region has a substantially greater depth than that of the source and the drain.

13. The method of claim 1, wherein essentially none of the dopant is implanted through the masking layer.

14. The method of claim 1, wherein the dopant also adjusts drive current and leakage current characteristics of the IGFET.

15. The method of claim 1, wherein the gate is polysilicon.

16. The method of claim 1, wherein the masking layer is photoresist.

17. A method of making an IGFET, comprising:
providing a semiconductor substrate with a device region;
forming a gate insulator on the device region;
forming a gate that includes first and second opposing sidewalls on the gate insulator;
forming a masking layer that covers a first portion of the gate and a first portion of the device region outside the gate without covering a second portion of the gate and a second portion of the device region outside the gate;
implanting a dopant into the first portions of the gate and the device region, using the masking layer as an implant mask, without implanting essentially any of the dopant into the second portions of the gate and the device region;
transferring the dopant through the first portion of the gate into a first portion of an underlying channel region in the device region without transferring essentially any of the dopant into a second portion of the channel region, such that the first and second portions of the channel region have substantially different doping concentrations, thereby providing the channel region with a non-uniform lateral doping profile and adjusting a threshold voltage; and
forming a source and a drain in the device region and adjacent to the channel region;
wherein the method further includes the following steps in the sequence set forth:
implanting lightly doped source and drain regions using the gate as an implant mask;
forming spacers adjacent to the first and second sidewalls;
forming the masking layer;
implanting the dopant;
removing the masking layer; and
implanting heavily doped source and drain regions using the gate and spacers as an implant mask.

18. The method of claim 17, wherein implanting the dopant includes implanting the dopant through the first portion of the gate into the first portion of the channel region, thereby transferring the dopant into the first portion of the channel region.

19. The method of claim 17, wherein implanting the dopant excludes implanting essentially any of the dopant through the first portion of the gate into the first portion of the channel region, and transferring the dopant includes applying a thermal cycle to diffuse the dopant from the first portion of the gate through the gate insulator into the first portion of the channel region.

20. The method of claim 17, wherein the first portion of the gate includes the first sidewall and the second portion of the gate includes the second sidewall.

21. The method of claim 17, wherein the second portion of the gate includes the first and second sidewalls and the first portion of the gate is between and spaced from the first and second sidewalls.

22. The method of claim 17, wherein the dopant and the channel region are a first conductivity type, and the dopant increases a doping concentration of the first portion of the channel region thereby adjusting the threshold voltage away from zero.

23. The method of claim 22, wherein the dopant decreases a drive current and a leakage current exhibited by the IGFET.

24. The method of claim 17, wherein the dopant and the channel region are opposite conductivity types, and the dopant decreases a doping concentration of the first portion of the channel region thereby adjusting the threshold voltage towards zero.

25. The method of claim 24, wherein the dopant increases a drive current and a leakage current exhibited by the IGFET.

26. The method of claim 17, including implanting the dopant before forming the source and the drain.

27. The method of claim 17, including implanting the dopant after forming the source and the drain.

28. The method of claim 17, wherein essentially all of the dopant in the first portion of the device region has a substantially greater depth with respect to a top surface of the substrate than that of essentially all of the dopant in the first portion of the channel region.

29. The method of claim 17, wherein essentially all of the dopant in the first portion of the device region has a substantially greater depth with respect to a top surface of the substrate than that of the source and the drain.

30. The method of claim 17, wherein the source and the drain are substantially aligned with the first and second sidewalls.

31. The method of claim 17, wherein the source is in the first portion of the device region, and the drain is in the second portion of the device region.

32. The method of claim 31, including implanting a second dopant into the first portions of the gate and the device region, using the making layer as an implant mask, without implanting essentially any of the second dopant into the second portions of the gate and the device region, such such that the first and second portions of the channel region have substantially different doping concentrations, thereby providing the channel region with a non-uniform lateral doping profile and adjusting a threshold voltage; and forming a source and a drain in the device region and adjacent to the channel region;

wherein the method further includes the following steps in the sequence set forth:
implanting lightly doped source and drain regions using the gate as an implant mask;
forming spacers adjacent to the first and second sidewalls;
forming the masking layer;
implanting the dopant;
removing the masking layer; and
implanting heavily dosed source and drain regions using the gate and spacers as an implant mask.

33. The method of claim 32, including implanting the dopant with a first implant energy and implanting the second dopant with a second implant energy that is substantially less than the first implant energy.

34. The method of claim 32, wherein the source includes a heavily doped source region that provides a channel junction, and the drain includes a lightly doped drain region that provides another channel junction.

35. The method of claim 17, wherein the gate is polysilicon and the masking layer is photoresist.

36. A method of making an IGFET, comprising:
providing a semiconductor substrate with a device region of first conductivity type;
forming a gate oxide on the device region;
forming a polysilicon gate that includes first and second opposing sidewalls on the gate oxide;
forming a photoresist layer that covers a first portion of the gate and a first portion of the device region outside the gate without covering a second portion of the gate and a second portion of the device region outside the gate;
implanting a dopant into the first portions of the gate and the device region, using the photoresist layer as an implant mask, without implanting essentially any of the dopant into the second portions of the gate and the device region;
transferring the dopant through the first portion of the gate into a first portion of an underlying channel region in the device region without transferring essentially any of the dopant into a second portion of the channel region, such that the first and second portions of the channel region are the first conductivity type and have substantially different doping concentrations of the first conductivity type, thereby providing the channel region with a non-uniform lateral doping profile and adjusting a threshold voltage exhibited by the IGFET; and forming a source and a drain of second conductivity type in the device region, adjacent to opposing ends of the channel region and substantially aligned with the first and second sidewalls, respectively, wherein essentially all of the dopant in the first portion of the device region has a substantially greater depth with respect to a top surface of the substrate than that of the channel region, the source and the drain.

37. The method of claim 36, wherein implanting the dopant includes implanting the dopant through the first portion of the gate into the first portion of the channel region, thereby transferring the dopant into the first portion of the channel region.

38. The method of claim 36, wherein implanting the dopant excludes implanting essentially any of the dopant through the first portion of the gate into the first portion of the channel region, and transferring the dopant includes applying a thermal cycle to diffuse the dopant from the first portion of the gate through the gate oxide into the first portion of the channel region.

39. The method of claim 36, wherein the first portion of the gate includes the first sidewall and the second portion of the gate includes the second sidewall.

40. The method of claim 36, wherein the second portion of the gate includes the first and second sidewalls and the first portion of the gate is between and spaced from the first and second sidewalls.

41. The method of claim 36, wherein the dopant is the first conductivity type and increases a doping concentration of the first portion of the channel region, thereby adjusting the threshold voltage away from zero and decreasing a drive current and a leakage current exhibited by the IGFET.

42. The method of claim 36, wherein the dopant is the second conductivity type and decreases a doping concentration of the first portion of the channel region, thereby adjusting the threshold voltage towards zero and increasing a drive current and a leakage current exhibited by the IGFET.

43. The method of claim 36, including
implanting a second dopant into the first portions of the gate and the device region, using the masking layer as an implant mask, without implanting essentially any of the second dopant into the second portions of the gate and the device region, such that the second dopant provides substantial doping for the source without providing essentially any doping for the drain; and forming the source in the first portion of the device region and the drain in the second portion of the device region, wherein the source includes a heavily doped source region that provides a channel junction, the drain includes a lightly doped drain region that provides another channel junction, and the IGFET is an asymmetrical device.

44. The method of claim 43, including implanting the dopant with a first implant energy and implanting the second dopant with a second implant energy that is substantially less than the first implant energy.

* * * * *

UNITED STATES PATENT AND TRADEMARK OFFICE
CERTIFICATE OF CORRECTION

PATENT NO. : 6,027,978
DATED : February 22, 2000
INVENTOR(S) : Duane, Michael; Gardner, Mark I.; Kadosh, Daniel It is certified that error appears in the above-indentified patent and that said Letters Patent is hereby corrected as shown below:

Claim 32, Row 17, Line 11, after "gate and the device region," delete
"such such that the first and second portions of the channel region
have substantially different doping concentrations, thereby
providing the channel region with a non-uniform lateral
doping profile and adjusting a threshold voltage; and
forming a source and a drain in the device region and
adjacent to the channel region;
wherein the method further includes the following steps in
the sequence set forth:
implanting lightly doped source and drain regions
using the gate as an implant mask;
forming spacers adjacent to the first and second sidewalls;
forming the masking layer;
implanting the dopant;
removing the masking layer; and
implanting heavily dosed source and drain regions
using the gate and spacers as an implant mask."

Claim 32, Column 17, line 11 after "gate and the device region," add --such that the second dopant provides substantial doping for the source without providing essentially any doping for the drain.--

Signed and Sealed this

Sixth Day of March, 2001

Attest:

NICHOLAS P. GODICI

Attesting Officer

Acting Director of the United States Patent and Trademark Office